US007803646B2

United States Patent
Fischer et al.

(10) Patent No.: US 7,803,646 B2
(45) Date of Patent: Sep. 28, 2010

(54) METHOD FOR PRODUCING A COMPONENT HAVING A SEMICONDUCTOR SUBSTRATE AND COMPONENT

(75) Inventors: Frank Fischer, Gomaringen (DE); Thorsten Pannek, Stuttgart (DE); Lars Metzger, Moessingen-Belsen (DE)

(73) Assignee: Robert Bosch GmbH, Stuttgart (DE)

( * ) Notice: Subject to any disclaimer, the term of this patent is extended or adjusted under 35 U.S.C. 154(b) by 756 days.

(21) Appl. No.: 10/544,821

(22) PCT Filed: Nov. 6, 2003

(86) PCT No.: PCT/DE03/03688

§ 371 (c)(1), (2), (4) Date: Apr. 24, 2006

(87) PCT Pub. No.: WO2004/071944

PCT Pub. Date: Aug. 26, 2004

(65) Prior Publication Data

US 2006/0258037 A1    Nov. 16, 2006

(30) Foreign Application Priority Data

Feb. 14, 2003 (DE) .................................. 103 06 129

(51) Int. Cl.
*H01L 21/00* (2006.01)
(52) U.S. Cl. .................. 438/48; 257/E21.564
(58) Field of Classification Search .............. 438/48; 257/E21.564
See application file for complete search history.

(56) References Cited

U.S. PATENT DOCUMENTS

| 5,231,878 A | 8/1993 | Zanini-Fisher et al. |
| 6,359,276 B1 | 3/2002 | Tu |
| 6,448,115 B1 * | 9/2002 | Bae .............................. 438/151 |
| 2002/0182787 A1 | 12/2002 | Bae |

FOREIGN PATENT DOCUMENTS

| DE | 100 58 009 | 6/2002 |
| EP | 1128435 | 8/2001 |
| WO | WO 02/081363 | 10/2002 |

OTHER PUBLICATIONS

Kaltsas, G. et al., "Novel C-MOS compatible monolithic silicon gas flow sensor with porous silicon thermal isolation", Sensors and Actuators A, Elsevier Sequoia S.A., Lausanne, Switzerland, vol. 76, No. 1-3, Aug. 30, 1999, pp. 133-138.
Lang,,W. et al., "Porous Silicon Technology for Thermal; Sensors", Sensors and Materials, Scientific Publishing Division of MYU, Tokyo, Japan, vol. 8, No. 6, 1996, pp. 327-344.

* cited by examiner

*Primary Examiner*—Thao X Le
*Assistant Examiner*—Elias Ullah
(74) *Attorney, Agent, or Firm*—Kenyon & Kenyon LLP

(57) ABSTRACT

A method for producing a component having a semiconductor substrate, in which porous semiconductor material is generated for the purpose of developing at least one thermally decoupled pattern. In the material that has been rendered porous, a recess or a plurality of recesses is/are etched to produce at least one region that is defined by the one recess or the plurality of recesses and is thermally decoupled. On the at least one region, the pattern to be thermally decoupled is then formed.

11 Claims, 2 Drawing Sheets

METHOD FOR PRODUCING A COMPONENT HAVING A SEMICONDUCTOR SUBSTRATE AND COMPONENT

FIELD OF THE INVENTION

The present invention relates to a method for producing a structural element having a semiconductor substrate and a component.

BACKGROUND INFORMATION

In the production of components based on thermal effects, methods in bulk micromechanics are mostly used. For this, expensive etching techniques having a high degree of complexity are typically required, in order to be able to lay bare a thin diaphragm on the front side of the wafer, by etching from the rear through a whole semiconductor wafer, which is used for thermal decoupling from structures mounted on it.

Alternatively, the two methods below may be used:
a) oxidized porous silicon (OxPorSi) and
b) oxidized silicon crosspieces (OXOMM, oxidized surface mechanics).

With respect to the two alternatives, processes for thermal decoupling are involved that are limited to purely front side processes. The methods have the advantage of a higher mechanical stability of the thermally decoupled region, and thus a higher overall stability of the component.

In the "OxPorSi" method, a relatively thick and poorly heat conducting (0.3 to 1 W/mK) porous silicon layer is generated which may, in addition, also be oxidized. Such layers are used, for example, for the thermal decoupling of sensor structures or actuator structures in thermal components, such as thermal, chemical, fluidic sensors and gas sensors.

A flow sensor is described in German Patent Application No. DE 100 58 009 A1, especially for the analysis of gas flows, that has a supporting body and at least one sensor component that is sensitive to the flow of a medium. The sensor component is separated, from area to area, from the supporting body by a porous silicon region or a porous silicon oxide region.

During the production of porous semiconductors, such as porous silicon, generally, an electrochemical reaction between hydrofluoric acid and silicon is used, during which a sponge-like structure is formed in the silicon. For this, the silicon semiconductor substrate (generally, a silicon wafer) has to be polarized anodically with respect to hydrofluoric acid electrolyte. As a result of the generation of a porous structure, the silicon develops a large internal surface and other chemical and physical properties (such as a lower heat conductivity), than the surrounding bulk silicon. By electrochemical etching of the silicon (anodizing) in, for instance, a mixture of hydrofluoric acid and ethanol, porous silicon may be generated by partial etching proceeding more deeply. For the etching of silicon, defect electrons (holes) are necessary at the interface between the silicon and the electrolyte, which are made available by the flowing current. If the current density is less than a critical current density, holes diffuse to recesses lying in the surface, because of the applied electrical field, and there a preferred etching takes place. In the case of, for example, p-doped silicon, the regions between the recesses are etched laterally up to a minimum thickness, until no more holes can penetrate into these regions because of quantum effects, and the etching process is stopped. In this manner, a sponge-like skeleton structure is created, made of silicon and etched-free pores. During the formation of the skeleton structure, since the etching process takes place only in the area of the tips of the pores, the spongy structure of the silicon already etched is maintained. Along with that too, the size of the pores in the regions already etched remains nearly unchanged. The size of the pores depends on the HF concentration in the hydrofluoric acid, on the doping and on the current density, and can amount to from a few nanometers to a few 10 µm. Likewise, the porosity can be set in a range from ca. 10% to more than 90%.

Various doped substrates can be used for producing porous silicon. Normally, one would use p-doped wafers having different degrees of doping. The pattern within the porous silicon can be determined by the doping.

There are various masking methods for the local production of porous silicon, such as the use of masking layers made of $Si_xN_y$.

However, one may also make use of the fact that p-doped and n-doped silicon have greatly different etching behavior. With the conditions under which porous silicon can be generated in p-doped silicon, in n-doped silicon this is not possible, or possible only to a small extent. Therefore, a layer at the surface of the p-doped substrate can be n-redoped for the purpose of determining the sensor element patterns (by ion implantation or diffusion).

For the production of components, the porous silicon is regularly generated locally on a silicon substrate in thicknesses of several to several 100 µm. By an oxidation process at temperatures such as 300 to 500° C., the porous silicon may be stabilized in its structure and its heat conductivity may be further reduced, depending on porosity and crystal size. Oxidized porous silicon is created. Subsequently, in one application, the oxidized porous silicon is closed off using a cover layer, for instance, made of CVD (chemical vapor deposition) materials such as $Si_xN_y$. Thereafter, using conventional depositing techniques and patterning techniques, one may build up the active or sensitive elements, such as heaters and/or measuring elements, above the region that has been rendered porous.

In the "OXOMM" method, trenches from several µm to several 100 µm are etched into the silicon by a deep etching process, so that silicon lattices, silicon crosspieces or free-standing silicon columns are created. These are oxidized to a higher valency completely or only partially, in order to reduce their thermal conductivity.

Thereafter, the trenches are regularly closed off by a CVD layer, and the surface is planarized if necessary, in order to apply the active and sensitive elements.

SUMMARY

An object of the present invention is to make available components in which thermal effects are used and which include a semiconductor material substrate, which have improved properties compared to components produced based on an "OxPorSi" or "OXOMM" method.

The present invention relates to a method for producing the component having a semiconductor substrate, in which porous semiconductor material is generated for the development of at least one thermally decoupled pattern. In accordance with an example embodiment of the present invention, in the material that is rendered porous, a recess or several recesses is/are etched, in order to generate at least one thermally decoupled region of the ones specified by the one recess or the several recesses, and, over the at least one region, the at least one pattern is extended.

This procedure is based on the knowledge that the components, both using the "OxPorSi" method and the present example method, do not achieve the quality of the thermal decoupling of a dielectric diaphragm produced by BMM technology, since both by the OxPorSi and by the crosspieces comparatively much heat is dissipated. For example, to achieve a constant overtemperature on OxPorSi of a thickness of 100 μm having a heat conductivity of 0.5 W/mK and 1 mm² extension, a 5-fold heating power is required as with a pattern produced by bulk micromechanics. If the two methods are combined, one obtains a pattern which, in comparison with a pure OXCOMM pattern, has a clearly lower vertical heat conductivity, and has almost ideal lateral insulating properties.

From the semiconductor that has been rendered porous, one may generate, for example, trenches, crosspiece patterns, columns that are arranged in a matrix-like fashion using corresponding recesses, on whose surface the patterns that are to be thermally decoupled are able to be mounted.

Stabilization and possibly further reduction of the vertical conductivity (that is, perpendicular to a semiconductor substrate) of the material regions that have been rendered porous may be achieved in that the semiconductor material that has been produced and rendered porous is at least partially oxidized after the application of the recesses, such as trenches.

However, oxidation of the semiconductor material that has been rendered porous may also be accomplished by the etching of recesses.

In one preferred specific embodiment of the present invention, the one or several recesses are etched over a thickness of the material that has been rendered porous only to a depth so that a desired lateral thermal decoupling takes place. It has been shown that a large part of the heat dissipates already in the first 5 to 30 μm depth of the patterns, so that it may be sufficient for a desired thermal functionality to pattern the material that has been rendered porous only over a corresponding part of the thickness, such as 50 μm. With that, depending on the thickness of the material that has been rendered porous, residual thicknesses of the material that has been rendered porous may remain.

Hard-surface masks or resist masks may be used to produce locally limited semiconductor material that has been rendered porous. Hard-surface masks may normally remain in the layer construction, since the patterns made of material that has been rendered porous are regularly closed off using an insulating cover layer before the building up of additional patterns.

In order further to improve the lateral thermal decoupling, it is also advantageous, especially in the case in which the masking remains in the layer structure, if the masking is underetched during the patterning of the regions rendered porous, by etching recesses. Therefore, because of the remaining masking, in spite of the greater lateral distances between the regions rendered porous, no greater lateral gaps have to be closed by the cover layer, because the opening width is determined by the mask.

An additional improvement in the thermal decoupling may be achieved by underetching isotropically at least one region, defined by one and/or several recesses in the base region, made of material that has been rendered porous. This procedure may be preferably applied especially if the material rendered porous is completely etched through with respect to the one or the several recesses, so that, in the base region, there is bulk semiconductor material that has not been rendered porous, which is able to be etched with great selectivity, particularly to form an oxidized pattern that has been rendered porous.

One is thereby able to generate completely self-supporting structures which, however, for stability reasons, should be laterally anchored.

Furthermore, the present invention relates to a component having a semiconductor substrate in which, for the development of at least one thermally decoupled pattern, at least one region that has been rendered porous made of a semiconductor material that has been rendered porous or that has been rendered porous and has been partially oxidized, is provided, to which the pattern, to be thermally decoupled, has been applied. In this component, the at least one region that has been rendered porous is separated from the surrounding material in the lateral direction at least partially by a cavity which is many times greater than the pores of the region that has been rendered porous.

As was mentioned above, in this manner, the good insulating properties of a trench structure in the lateral direction may be combined by an improved vertical insulation based on material that has been rendered porous, especially the good mechanical stability of such a construction being still able to be used.

The construction is of advantage particularly if several regions that have been rendered porous are present, which are separated at least in one direction by cavities. The component may, for example have a plurality of columns which have been rendered porous over at least a part of their height. However, a crosspiece structure is perhaps also sufficient, i.e., a structure which has a lateral connection to the bulk material at sides lying opposite to each other.

Optimization with regard to lateral insulation of one or more regions that have been rendered porous is achieved by having the cavity extend completely around the one or the several regions that have been rendered porous, in the lateral direction. As an example for this we may give the column structure that was mentioned above.

With respect to a vertical insulation, a component may be further improved if the cavity, in addition, also extends under the one or the several regions that have been rendered porous. For instance, a column structure or a crosspiece structure may be implemented in which the columns or the crosspieces "hang freely".

BRIEF DESCRIPTION OF THE DRAWINGS

Several exemplary embodiments of the present invention are shown in the figures, and are explained in greater detail below.

DESCRIPTION OF EXAMPLE EMBODIMENTS

Figure 1A:
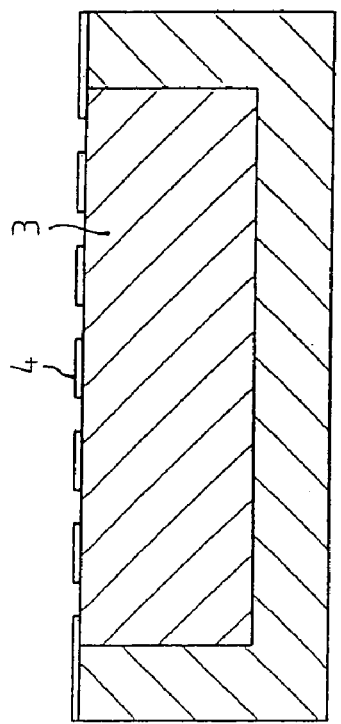
FIGS. 1a-1c show a silicon substrate for the production of a thermal component having regions that have been rendered porous, each as a schematic section, at different stages of processing.
Figure 1B:
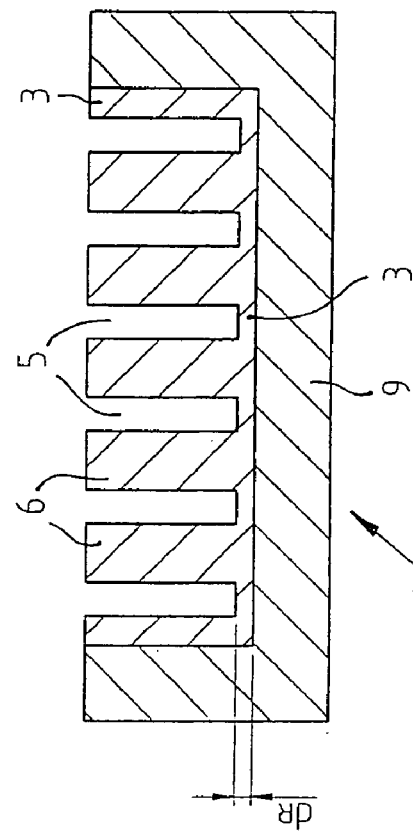
Figure 1C:
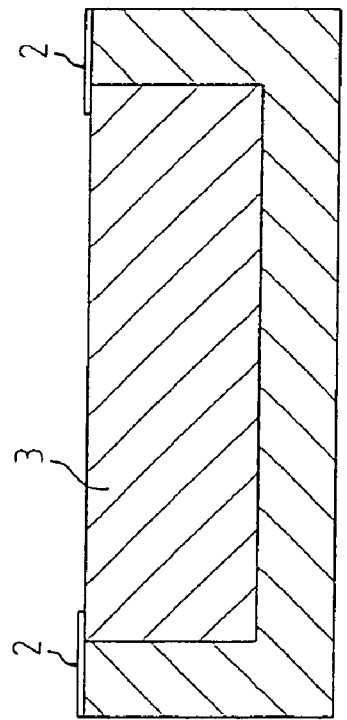

FIGS. 1a to 1c show respectively, in section, the creation of a thermal component based on a silicon wafer 1.

In a first step, using a mask 2, locally, porous silicon 3 is produced (see FIG. 1a).

Onto the porous silicon, an additional mask 4 is applied (see FIG. 1b), with the use of which trenches 5 are etched into the porous silicon 3 using a DRIE process (see FIG. 1c). Accordingly, crosspieces 6 remain, made of silicon that has been rendered porous.

Figure 1D:
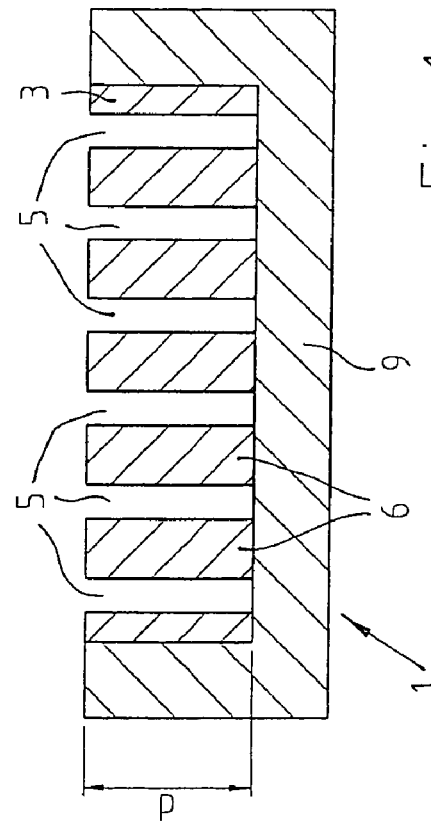
FIG. 1d shows a production state comparable to FIG. 1c, however, having a slightly changed process mechanism.

Since it has turned out that, in the lateral direction, a great part of the quantity of heat is dissipated already at the first 5 to 30 µm depth from the crosspieces or columns, it is, if necessary, sufficient for a desired thermal functionality to proceed as in FIG. 1d. Here, the porous silicon was not, as in FIG. 1c, etched through over its whole thickness d, but only over a part of thickness d. Accordingly, there remains, as shown in FIG. 1d, a residual thickness $d_R$ of porous silicon. This has the advantage of a shorter etching time and a greater stability of the porous structures.

In FIGS. 1c and 1d, the masking used for producing the porous silicon and the generation of trenches 6 has already been removed.

However, inasmuch as a "hard-surface mask" (that is, not a photoresist mask) is used for the masking, it may remain in the layer construction, even advantageously. This is shown especially in FIGS. 2 and 3.

In the generation of the thermal structures, trenches 6 are regularly closed, for instance, by a CVD layer (chemical vapor deposition layer). The thickness of the layer required for closing depends on the trench width b of trenches 5.

Figure 4:
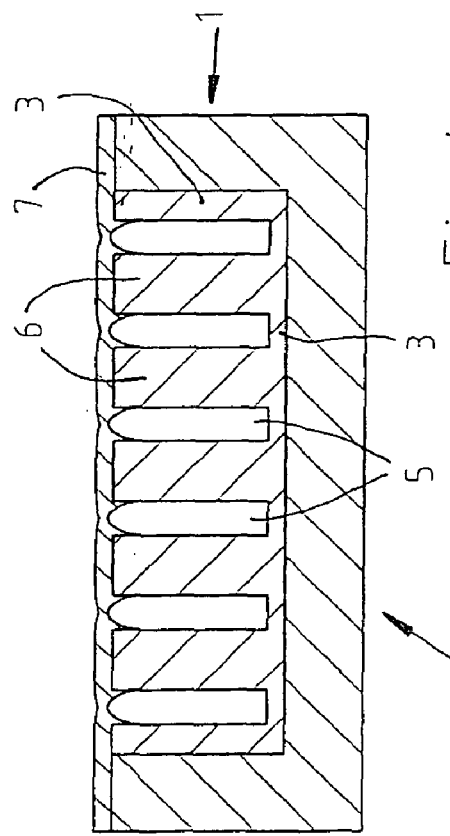
FIG. 4 shows a schematic sectional view of a silicon substrate in an further production state starting from the construction according to FIG. 1d.

A wide trench width b is of advantage for good lateral insulation, but has a disadvantage with respect to the necessary thickness of a cover layer 7 (see FIG. 4).

Figure 3:
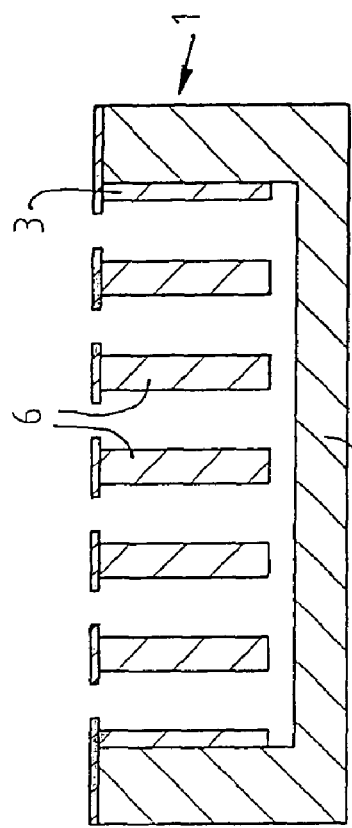
FIG. 3 shows a schematic sectional view of a layer construction corresponding to FIG. 2, in which, however, structures that have been rendered porous are executed in a freely hanging manner.
Figure 2:
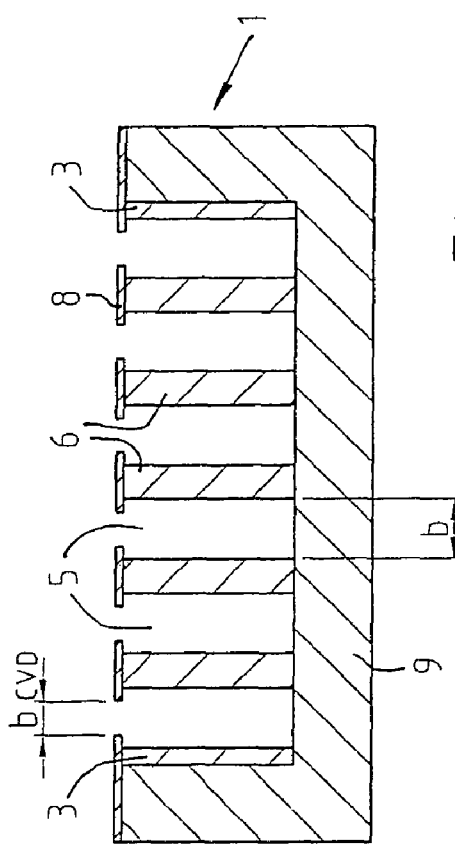
FIG. 2 shows a schematic sectional view of a silicon substrate during the production of a thermal component, using a method in which a mask remains in the layer construction.

Because of the remaining masking in the layer construction, according to FIGS. 2 and 3, a process may be selected in which masking 8 is purposefully underetched in order to achieve a width b of trenches 5. Still, width $b_{CVD}$, that is decisive for the cover layer, is defined by mask 8.

In this way, one consequently obtains sufficiently wide trenches, but is able to work, all the same, with a comparatively thin cover layer, since the width $b_{CVD}$, which is decisive in this regard, is below the width b of trenches 5. This means that the minimum necessary layer thickness for closing is determined by width $b_{CVD}$ of the mask opening of hard-surface mask 8.

The degree of underetching may be determined to be very large, whereby crosspieces 6, having low heat dissipation into the depth, and wide trenches are created, which ensure an almost complete lateral insulation. In this manner, the effective porosity of the structure is increased.

After one process state according to FIGS. 1c, 1d or 2, the porous silicon is partially oxidized, for the stabilization of the pores with respect to high temperature processes and for the further reduction of the heat conductivity, in a pure oxygen atmosphere, for example, at, for instance, 300 to 500° C. Oxidized porous silicon is created.

After the oxidation, in variants according to FIG. 1c and FIG. 2, in an advantageous manner, the thermal decoupling may be improved even more by an isotropic etching process, for instance, using $XeF_2$ or $ClF_3$. In this context, the high selectivity of the etching process, for the porous silicon crystals that are enclosed by oxide, is utilized, which permits a preferred etching of bulk silicon 9 under porous silicon 3 (or the porous crosspieces or columns 6). A structure is created as in FIG. 3, having free-hanging crosspieces or columns 6. For reasons of stability, only a laterally anchored column structure or crosspiece structure is suitable in this case, since the columns or crosspieces are hanging freely.

Before structures that are to be thermally decoupled are applied, the recesses developed in the porous silicon or the oxidized porous silicon are regularly developed, using a cover layer 7 (for this see FIG. 4), for example, in the case of crosspieces in the form of longitudinal trenches, and in the case of columns in the form of longitudinal trenches and transverse trenches. The cover layer may be a CVD cover layer, such as a silicon oxide layer.

FIG. 4 shows the production state illustrated in Figure d and having cover layer 7.

For the additional construction of the structures to be thermally decoupled (not shown), the cover layer may additionally be planarized.

The structures to be thermally decoupled are preferably applied over the remaining structures that have been rendered porous, i.e., particularly the columns or crosspieces.

The components to be thermally decoupled may be active or sensitive elements, such as heating elements, measuring resistors or thermoelements. Especially heating elements and measuring resistors are preferably applied over the regions that have been rendered porous.

Because of the procedure according to the present invention, in comparison to conventional processes, sensors that are more robust and simpler to handle are able to be made available, especially mass flow sensors.

What is claimed is:

1. A method for producing a component having a semiconductor substrate, comprising:
   rendering a semiconductor material porous;
   etching at least one recess into the material that has been rendered porous to generate at least one thermally decoupled region defined by the at least one recess;
   covering an upper opening of the at least one recess and at least a portion of the semiconductor material that has been rendered porous with a cover layer; and
   after the covering, developing at least one thermally decoupled pattern over the at least one thermally decoupled region such that the cover layer is disposed between the at least one thermally decoupled pattern and the at least a portion of the semiconductor material that has been rendered porous, the cover layer laterally overlapping an upwardly directed surface of the rendered-porous semiconductor material during the developing of the at least one thermally decoupled pattern wherein the cover layer directly contacts the top surface of the rendered-porous semiconductor material during the developing of the at least one thermally decoupled pattern.

2. The method as recited in claim 1, wherein the semiconductor material that has been rendered porous is at least partially oxidized after the patterning.

3. The method as recited in claim 1, wherein the semiconductor material that has been rendered porous is at least partially oxidized before the patterning.

4. The method as recited in claim 1, wherein the at least one recess is etched over a thickness d of the material that has been rendered porous, so that a desired lateral, thermal decoupling takes place.

5. The method as recited in claim 1, wherein one of hard-surface masks or photoresist masks are used to produce the at least one recess.

6. The method as recited in claim 5, wherein the at least one region that is defined by the at least one recess is underetched under the masks.

7. The method as recited in claim 1, wherein the at least one region that is defined by the at least one recess is underetched isotropically in a base region from material that has been rendered porous.

8. The method as recited in claim 1, wherein the cover layer extends continuously laterally across the entire upwardly directed surface of the rendered-porous semiconductor material during the developing of the at least one thermally decoupled pattern.

9. The method as recited in claim 1, wherein the upwardly directed surface is exposed prior to the covering of the upper opening, the cover layer being deposited directly onto the upwardly directed surface during the covering of the upper opening.

10. The method as recited in claim 1, wherein, after the covering, an exposed surface of the at least one recess is formed by an exposed surface of the rendered-porous semiconductor material.

11. A method comprising:
rendering a semiconductor material porous;
etching a plurality of recesses into an upper surface of the material that has been rendered porous to generate at least one thermally decoupled region defined by the recesses;
covering upwardly directed openings of the recesses with a cover layer; and
after the covering, developing at least one thermally decoupled pattern over the at least one thermally decoupled region such that the cover layer is disposed between the at least one thermally decoupled pattern and the at least a portion of the semiconductor material that has been rendered porous, the cover layer extending continuously to cover all of the recesses during the developing of the at least one thermally decoupled pattern wherein the cover layer directly contacts the top surface of the rendered-porous semiconductor material during the developing of the at least one thermally decoupled pattern.

* * * * *